(12) United States Patent
Blodgett

(10) Patent No.: US 6,778,459 B2
(45) Date of Patent: *Aug. 17, 2004

(54) FUSE READ SEQUENCE FOR AUTO REFRESH POWER REDUCTION

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/413,864

(22) Filed: Apr. 14, 2003

(65) Prior Publication Data

US 2003/0174568 A1 Sep. 18, 2003

Related U.S. Application Data

(63) Continuation of application No. 09/651,391, filed on Aug. 29, 2000, now Pat. No. 6,570,804.

(51) Int. Cl.[7] .................................................. G11C 7/00
(52) U.S. Cl. ..................... 365/225.7; 365/194; 365/222
(58) Field of Search ............................. 365/225.7, 222, 365/189.01, 194, 96

(56) References Cited

U.S. PATENT DOCUMENTS

| 4,680,737 | A | | 7/1987 | Oishi et al. |
|---|---|---|---|---|
| 5,455,801 | A | | 10/1995 | Blodgett et al. |
| 5,594,699 | A | | 1/1997 | Nomura et al. |
| 5,859,801 | A | | 1/1999 | Poechmueller |
| 5,875,144 | A | | 2/1999 | Zheng |
| 5,978,297 | A | | 11/1999 | Ingalls |
| 6,064,617 | A | | 5/2000 | Ingalls |
| 6,088,282 | A | | 7/2000 | Loughmiller et al. |
| 6,097,644 | A | * | 8/2000 | Shirley ...................... 365/200 |
| 6,166,980 | A | | 12/2000 | Chun |
| 6,246,623 | B1 | | 6/2001 | Ingalls |
| 6,255,894 | B1 | | 7/2001 | Cutter et al. |

* cited by examiner

Primary Examiner—Son T. Dinh
(74) Attorney, Agent, or Firm—TraskBritt

(57) ABSTRACT

A fuse read sequence for a memory device obtains enhanced energy efficiency by selectively reading or strobing antifuse or fuse circuit banks of the memory device in response to operational commands of the memory device. More particularly, the column antifuse circuit banks of an SDRAM are read in response to a load mode register command and the row and option antifuse circuit banks are read in response to auto refresh commands. Furthermore, only half of the row/option antifuse circuit banks are read on each auto refresh command.

7 Claims, 7 Drawing Sheets

FUSE READ SEQUENCE FOR AUTO REFRESH POWER REDUCTION

CROSS-REFERENCE TO RELATED APPLICATION

This application is a continuation of application Ser. No. 09/651,391, filed Aug. 29, 2000, now U.S. Pat. No. 6,570,804, issued May 27, 2003.

BACKGROUND OF THE INVENTION

1. Field of the Invention

The present invention relates generally to integrated circuit memory devices and, more specifically, to a method and apparatus for selectively reading antifuse circuits in a memory device.

2. State of the Art

Conventional memory devices, such as synchronous dynamic random access memory (SDRAM), are typically tested to locate defects and failures before being packaged. The memory cells of SDRAM are usually tested to identify defective memory. Predetermined data values are written to selected row and column addresses corresponding to memory cells. Data values are read from the memory cells to determine if the data read matches the data written to those memory cells. If the data read does not match the written data, the memory cells are likely to be defective such that the SDRAM will not operate properly.

To avoid loss of SDRAM memory capacity due to minor defects in memory cells, the SDRAM are fabricated with rows and columns of redundant memory cells which can be substituted for the defective memory cells. Substitution of defective memory cells is accomplished by opening a specific combination of fuses, or closing a specific combination of antifuses, which are located in fuse or antifuse banks on the SDRAM. The combination of fuses or antifuses opened or closed identifies the defective memory cells such that the control components of the SDRAM may identify the defective memory cells and substitute memory cells from the redundant memory cells.

Conventional fuses are resistive devices which may be opened or broken with a laser beam or an electric current. Antifuses are capacitive devices that may be closed or blown by breaking down a dielectric layer in the antifuse with a relatively high voltage. The fuses or antifuses are conventionally arranged in groups such that one group corresponds to a row or column memory address. In this manner, the row or column address of defective memory cells may be identified by closing or opening the fuses or antifuses. For example, if the memory cell addresses in an SDRAM are 8-bit binary addresses, such as an address of 01001001, then the appropriate antifuses in a set of eight (8) antifuses are closed to store the addresses of the defective memory cells. The addresses of the defective memory cells are then determined before the read and write functions of the SDRAM so that redundant memory cells may be used to replace the defective memory cells.

The process of substituting redundant memory cells for defective memory cells in an SDRAM may be better understood with a description of the general layout and processes of an SDRAM. FIG. 1 illustrates a block diagram of a conventional SDRAM 100. The SDRAM 100 includes an address register 110 which receives row, column and bank addresses from an address bus 112. The address bus 112 is generally coupled to a memory controller (not shown). Typically, the row address and bank address received by the address register 110 are applied to a row address multiplexer 116. The row address multiplexer 116 couples the row address to one of the row address latches 118 depending on the state of the bank address received from the address register 110. Each of the row address latches 118 stores the row address and applies it to a row decoder (not separately shown) which is part of the address latches 118. The row decoder applies various signals to a respective memory bank array 120 as a function of the stored row address. The row address multiplexer 116 also couples row addresses to the row address latches 118 for the purpose of refreshing memory cells in the memory bank arrays 120. The row addresses are generated for refresh purposes by a refresh counter 114 that is controlled by a refresh controller (not shown). The memory bank arrays 120 are comprised of memory cells arranged in rows and columns.

After the row address is applied to the address register 110 and stored in one of the row address latches 118, a column address is applied to the address register 110. The address register 110 couples the column address to a column address latch 122. The column address latch 122 applies a column address to a column decoder 124 which applies various column signals to respective sense amplifiers and associated column circuits 126 for the respective memory bank arrays 120.

Data to be read from one of the memory bank arrays 120 are coupled from the arrays 120 to a data bus 150 through the column circuit 126 and a read data path that includes a data output register 152. Data to be written to one of the memory bank arrays 120 are coupled from the data bus 150 through a write data path, including a data input register 154 to the column circuits 126 where they are transferred to one of the memory bank arrays 120.

The operation of the SDRAM 100 is controlled by a control logic circuit 160, which includes a command decode circuit 162 and a mode register 164. The control logic circuit 160 is responsive to high-level command signals received from a control bus 166 through the command decode circuit 162. The high-level command signals, which are typically generated by the memory controller, are a chip select signal CS#, a write enable signal WE#, a row address strobe signal RAS#, and a column address strobe signal CAS#. The memory controller also typically provides a clock enable signal CKE and a clock signal CLK through the control bus 166 to the control logic circuit 160. The "#" designates the signal as active low. The control logic circuit 160 generates a sequence of command signals responsive to the high-level command signals to carry out a function (e.g., a read or a write) designated by each of the high-level command signals. The command signals, and the manner in which they accomplish their respective functions, are conventional and well known in the art. Therefore, a further explanation of the command signals will be omitted.

An SDRAM 100 also includes fuse or antifuse banks 170. When a memory address in the SDRAM 100 is accessed, the memory address is compared to defective memory addresses stored in the antifuse banks 170 to determine whether the incoming address is an address of a defective memory cell. If the memory address corresponds to a defective memory address, a corresponding redundant memory address is accessed instead of the defective memory address sent to the SDRAM 100. In this manner, rows and columns of defective memory cells may be bypassed and substituted with redundant memory cells.

The antifuse banks 170 generally include banks of antifuses corresponding to column addresses, row addresses, and device options. The column and row antifuses define the addresses of the defective memory cells and the option addresses are used for device configuration and circuit trimming. Each of the column, row and option fuse banks may also be separated into additional banks, for example, a first option fuse bank and a second option fuse bank.

Prior to reading or writing to an SDRAM 100, the antifuses must be read. In order to guarantee that all of the antifuse banks 170 are properly read, some SDRAMs 100 employ model antifuse circuits to generate a signal of sufficient length to read all of the antifuse banks 170 on the SDRAM 100. For example, U.S. Pat. No. 5,978,297 describes a model antifuse circuit which accepts a fuse read signal and converts it to a fuse read signal having a duration long enough to assure that all of the antifuse banks on an SDRAM may be read. The disclosure of U.S. Pat. No. 5,978,297 is incorporated herein by reference. When a trigger signal is sent to the model antifuse circuit, an antifuse read signal is created and used to strobe or read all of the antifuses on the SDRAM.

SDRAM specifications often require two auto refresh cycles and a load mode register cycle before an active command is issued. Typically, all of the antifuse banks 170 are strobed or read during each auto refresh cycle and the load mode cycle. Reading each of the antifuse banks 170 in this manner dissipates a substantial amount of power. Reducing the number of times the antifuse banks 170 are read during operation would reduce the amount of power used by each SDRAM 100, resulting in substantial power savings and increased energy efficiency.

Therefore, it would be advantageous to provide a fuse read sequence wherein the antifuse banks of a memory device are not strobed or read in response to every load mode register command or auto refresh command. By decreasing the number of times that each antifuse bank is read, power is conserved, providing a more energy efficient memory device.

BRIEF SUMMARY OF THE INVENTION

The present invention involves a method and apparatus for selectively reading fuse or antifuse banks in a memory device, for example, an SDRAM. A fuse read control selectively toggles a fuse read signal between column antifuse banks, row antifuse banks, and option antifuse banks. Another embodiment of the invention provides a toggle circuit for toggling a fuse read signal between two groups of antifuse banks, for example, a first half of the row antifuse banks and a second half of the row antifuse banks.

A fuse read control incorporated in an SDRAM converts a command signal, such as a load mode register command or an auto refresh command, to a fuse read signal. Depending upon the type of command signal received by the fuse read control, antifuse banks are selected for reading. If the fuse read control receives a load mode register command, a fuse read signal is directed to the column antifuses of the SDRAM. Similarly, an auto refresh command triggers the fuse read control to generate a fuse read signal for the row and option antifuses of the SDRAM.

A toggle circuit incorporated into a fuse read sequence of an SDRAM allows selected banks of antifuses or portions of selected antifuse banks to be read. For example, the row and option antifuses of an SDRAM may be separated into two groups of banks, a first row/option antifuse bank group and a second row/option antifuse bank group. A fuse read signal generated in response to an auto refresh command passed through a toggle circuit reads the first row/option antifuse bank group and toggles the toggle circuit. The next fuse read signal generated in response to an auto refresh command passing through the toggle circuit reads the second row/option antifuse bank group. The second fuse read signal also toggles the toggle circuit such that the next fuse read signal will again read the first row/option antifuse bank group. Thus, it takes two fuse read signals to read all of the row/option antifuse banks.

The fuse read control, or toggle circuit, may also be coupled with, or include, a fuse model circuit for setting the duration of the fuse read signal such that all of the fuses are read for a sufficient period of time to guarantee valid information is read. A command signal, whether a load mode register command, an auto refresh command, or a fuse read signal, passed to a fuse model circuit is converted to a fuse read signal of sufficient duration to read all of the desired fuses or antifuses selected by the fuse read control or toggle circuit.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Memory devices, such as SDRAM, may include banks of fuses, antifuses, or both, which are strobed or read during operation of the memory device. For the purposes of this invention, a memory device having banks of antifuses will be described. However, it is understood that fuses may be used in place of antifuses and strobed or read in a similar manner to the antifuses described hereinafter. One having ordinary skill in the art understands the differences and similarities between fuses and antifuses and their uses in memory devices. For example, a description of an antifuse bank read sequence may be taken as describing a read sequence for a bank of fuses for memory devices using fuses instead of antifuses.

SDRAM specifications require two auto refresh cycles and a load mode register command before a row active command is issued. Auto refresh commands, load mode register commands, and active row commands are well-known to those skilled in the art and will not be further described herein. Prior to the issuance of a row active command, all of the SDRAM row antifuses and option antifuses must be read. Typically, the row antifuses and option antifuses are read in response to each auto refresh command and each load mode register command. In addition, column antifuses are read at the same time even though the column antifuses only need to be valid prior to the first read or write cycle. Multiple reads of the antifuses during the cycling of a memory device expends unnecessary power and decreases the energy efficiency of the memory device. These multiple antifuse reads are therefore undesirable.

Figure 1:
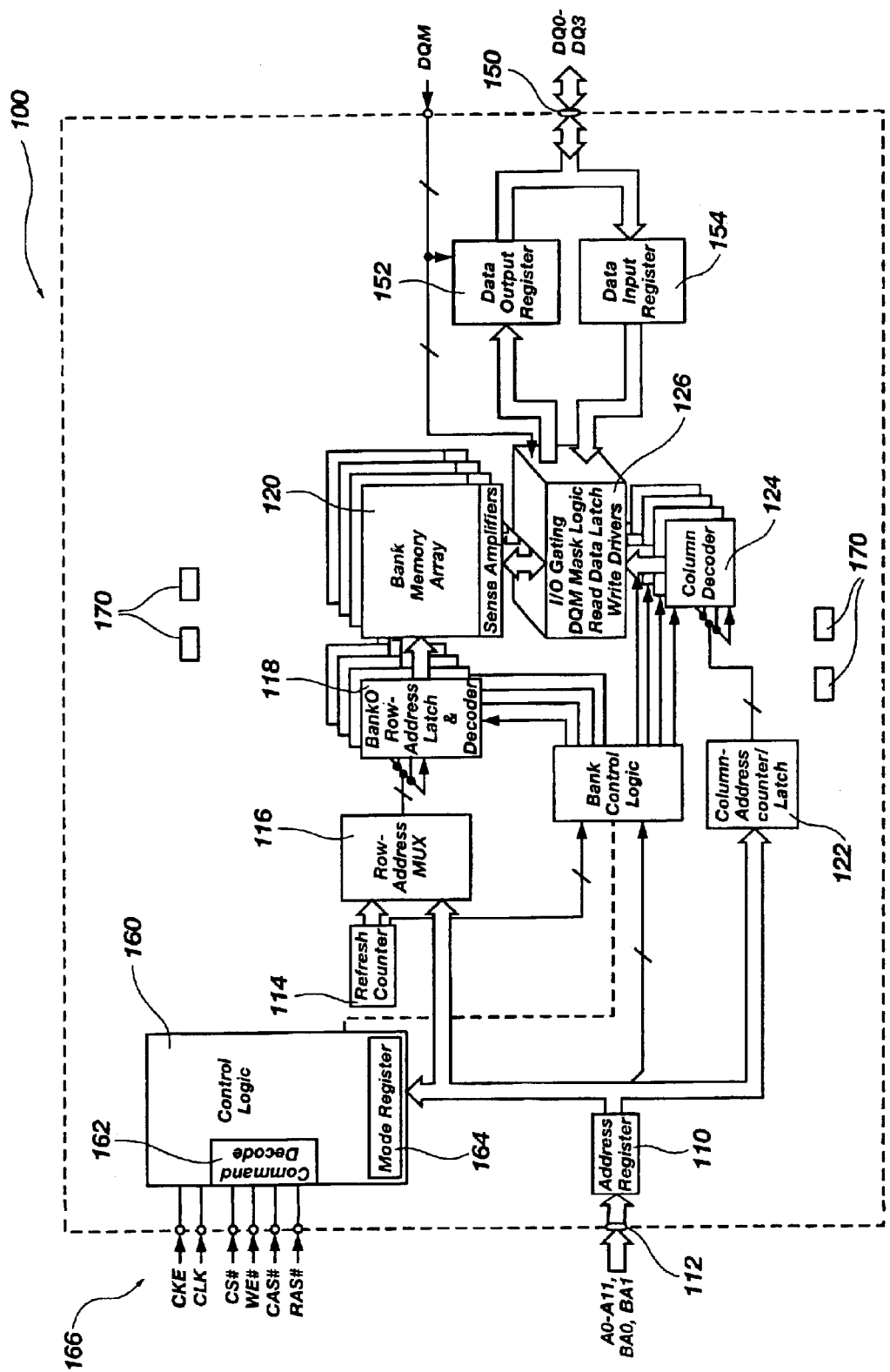
FIG. 1 is a block diagram of a representative SDRAM memory device of the prior art.
Figure 2:
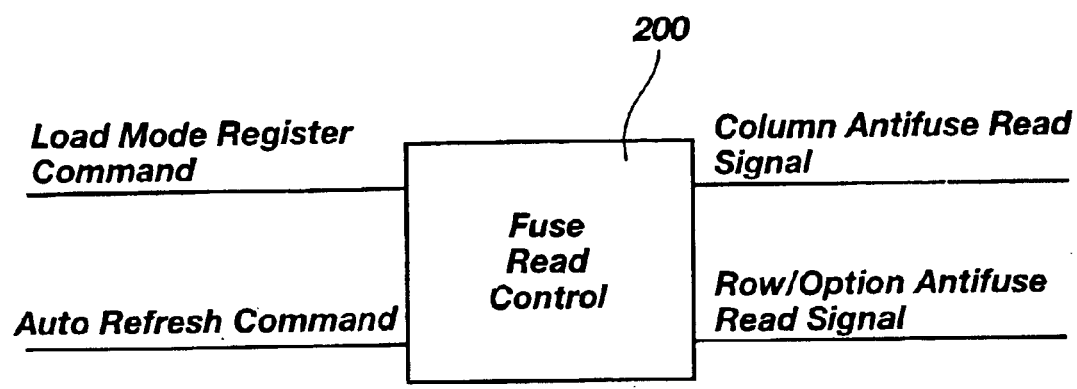
FIG. 2 is a block diagram of a fuse read control.

The present invention provides alternative antifuse read sequences. The invention reduces excessive power expenditures and improves the energy efficiency of memory devices. One embodiment of the invention involves the use of a fuse read control 200 with the memory device. The inputs and outputs of the fuse read control 200 of the present invention are illustrated in FIG. 2. Load mode commands and auto refresh commands generated in response to high-level commands issued to the memory device are passed to the fuse read control 200. Using logic circuits known in the art, the fuse read control 200 generates a row/option antifuse read signal in response to each auto refresh command and a column antifuse read signal in response to load mode register commands, thus eliminating any unnecessary reads of the column antifuses during each auto refresh cycle. This sequence conserves a considerable amount of energy because, instead of reading the column antifuses three times prior to the first row active command, the column antifuses are only read once prior to the first row active command. Similarly, the row/option antifuses are not read during the load mode register command, eliminating one of three row/option antifuse reads prior to the first row active command. Elimination of the excess reads conserves power, providing a more energy efficient memory device.

For example, high-level commands, as known in the art, are received by a control logic circuit of a memory device. A series of command signals, such as a load mode register command or an auto refresh command, is generated by the control logic circuit of the memory device in response to the high-level commands. If the command signal is a load mode register command or an auto refresh command, it is passed to the fuse read control 200. The fuse read control 200 interprets the command signal and generates an antifuse read signal in response to the command signal. If the command signal is a load mode register command, a column antifuse read signal is generated. The column antifuse circuits of the memory device are then read by the column antifuse read signal. Similarly, if the command signal is an auto refresh command, a row/option antifuse read signal is generated to read the row/option antifuse circuits of the memory device. Use of the fuse read control 200 with a memory device decreases the number of times both the column antifuses and the row/option antifuses are read, thereby decreasing the power consumption of the memory device.

Figure 3:
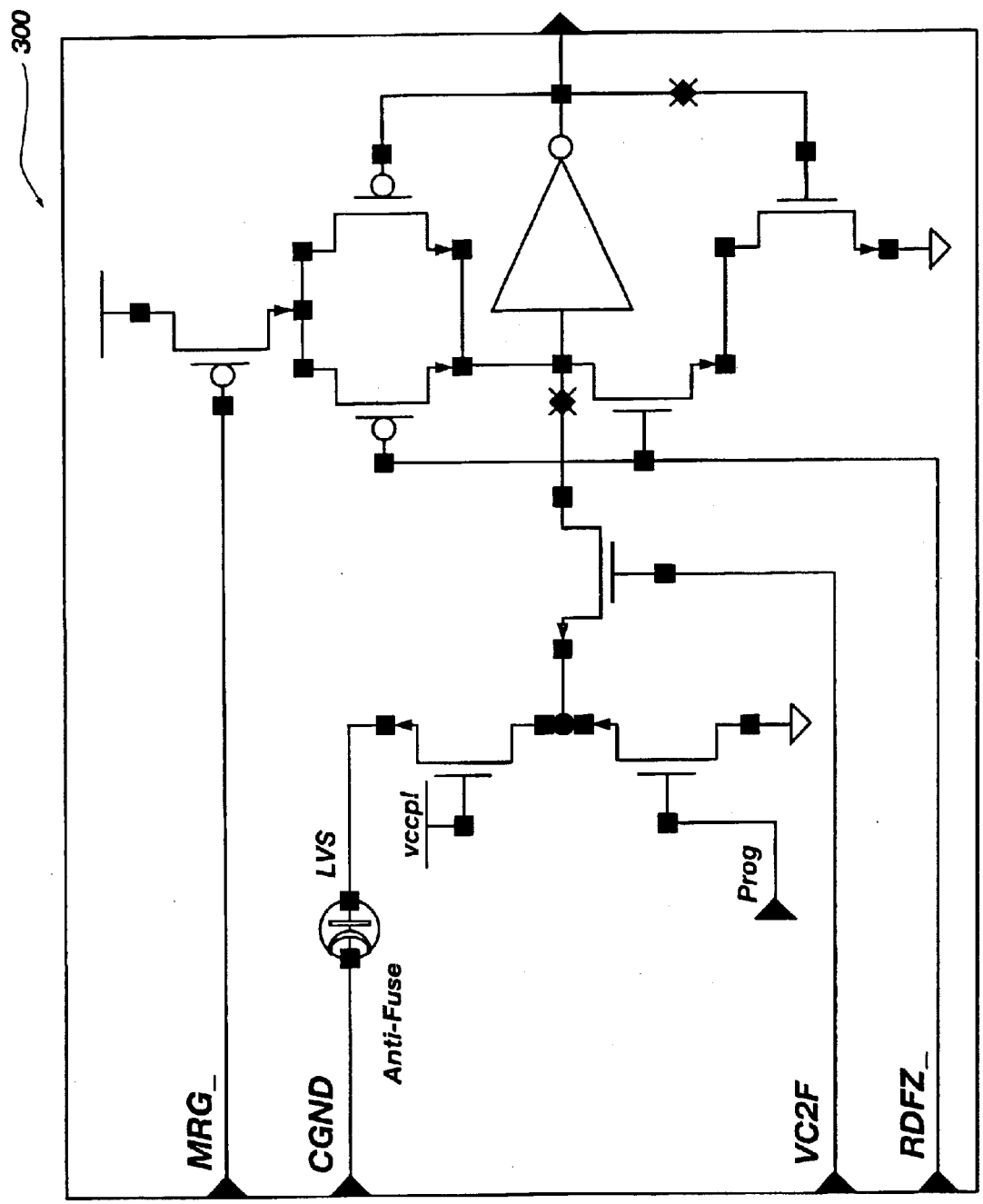
FIG. 3 is a circuit diagram of a real fuse latch circuit which may be found in memory devices such as SDRAM.
Figure 4:
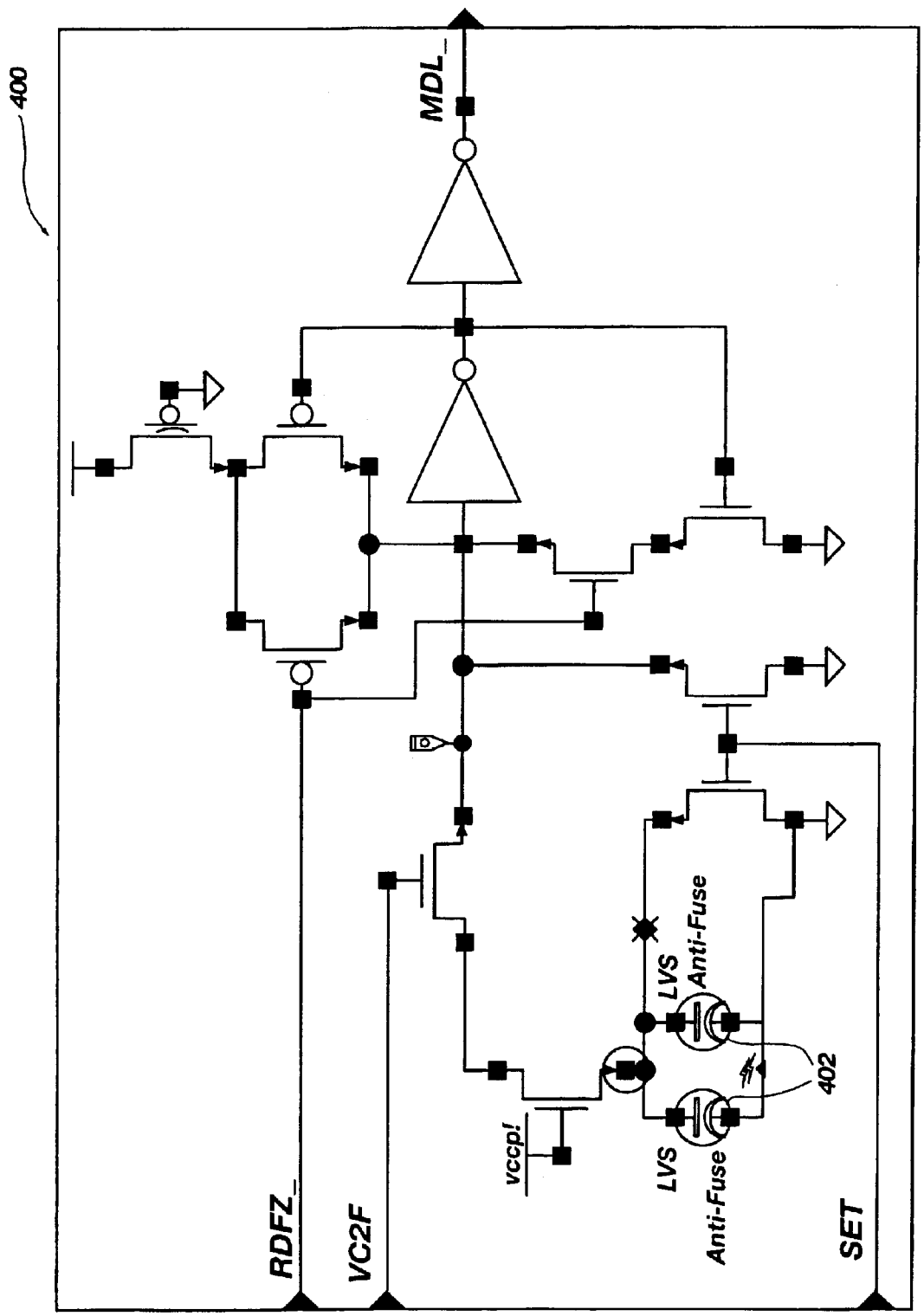
FIG. 4 is a circuit diagram of a model fuse circuit as found in the prior art.

FIG. 3 illustrates a real fuse latch circuit 300 similar to an antifuse latch circuit found in the antifuse banks of a memory device. Operation of a real fuse latch circuit 300 is well known in the art. To ensure that a fuse read signal generated in response to a command signal is of sufficient duration to read the plurality of real fuse latch circuits 300 in an antifuse bank, the fuse read control 200 may be coupled with a fuse model circuit 400 for controlling the duration of the antifuse read signal. The fuse model circuit 400 illustrated in FIG. 4 emulates a real fuse latch circuit 300 and generates a read fuse signal of sufficient duration to read the desired antifuses. The fuse model circuit 400 illustrated in FIG. 4 is similar to that disclosed in U.S. Pat. No. 5,978,297; therefore, only a limited description of the fuse model circuit 400 in operation with the present invention is provided. Incorporation of a fuse model circuit 400 further enhances the energy-saving characteristics of the present invention.

The fuse model circuit 400 is used to ensure that the fuse read signal is of sufficient duration to read all of the fuses which it is required to read. It accomplishes this task by providing an antifuse circuit similar to those found in the real fuse latch circuits 300 of a memory device. Initially, the antifuses 402 of the fuse model circuit 400 are in a worst case state. A trigger, such as a load mode register command, passed to the fuse model circuit 400 at the SET point triggers the fuse model circuit 400 to produce an antifuse read signal having a defined duration. The duration is set by the time required for the antifuses 402 of the fuse model circuit 400 to transition out of the worst case state. Once the antifuses 402 have made the transition, the antifuse read signal is terminated. The fuse model circuit 400 thereby maintains the antifuse read signal for a duration sufficient to read all of the desired antifuse circuit banks.

In operation, the fuse model circuit 400 is incorporated into the fuse read control 200 such that a single fuse model circuit 400 may be used to set either the column antifuse read signal or the row/option antifuse read signal. Similarly, multiple fuse model circuits 400 may be incorporated with each antifuse read signal generated by the fuse read control 200. For example, the fuse read control 200 receiving a load mode register command would pass a signal for a column antifuse read to a first fuse model circuit 400 which would generate a column antifuse read signal of sufficient duration to read the column antifuse banks of the memory device. Similarly, an auto refresh command received by the fuse read control 200 would generate a row/option antifuse read signal which would be passed to a second fuse model circuit 400. The second fuse model circuit 400 would create a row/option antifuse read signal of sufficient length to read all of the row/option antifuse banks of the memory device.

In another embodiment of the present invention, only half of the row/option fuses or antifuses are read or strobed on each auto refresh command. Two auto refresh cycles are typically required before a row active command in an SDRAM. If all of the row/option antifuses are not read on each auto refresh command, energy is conserved. If a first half of the row/option antifuse banks are read on a first auto refresh command and a second half of the row/option antifuse banks are read on a second auto refresh command, each of the antifuse banks is only read once, instead of twice as in the prior art. Using this embodiment of the invention, all of the row/option antifuse banks may be read before a row active command and energy is conserved because the row/option antifuse banks are read only once rather than twice.

Figure 5:
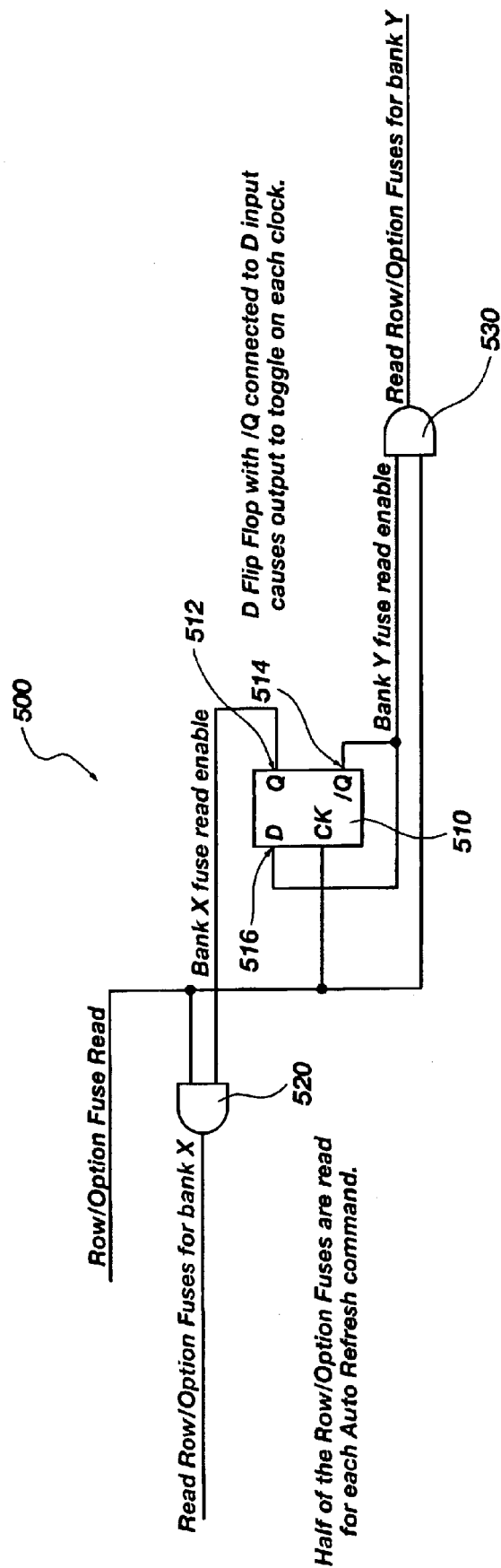
FIG. 5 is a circuit diagram of the antifuse read signal toggle circuit of the present invention.

This particular embodiment of the present invention may be implemented by the addition of a circuit 500 to intercept and alter the row/option antifuse read signal. An exemplary circuit 500 used to achieve this embodiment of the invention is illustrated in FIG. 5. The circuit 500 toggles the row/option antifuse read signal between two banks of antifuses. The circuit 500 includes a D flip-flop 510 and two AND gates: an X bank AND gate 520 and a Y bank AND gate 530. A first output 512 of the D flip-flop 510 is also one of the inputs for the X bank AND gate 520. A second output 514 of the D flip-flop 510 is also one of the inputs of the Y bank AND gate 530. The first output 512 and the second output 514 of the D flip-flop 510 always contain the opposite logic value. In other words, if the first output 512 is high, the second output 514 is low. Likewise, if the first output 512 is low, the second output 514 is high. The second output 514 of the D flip-flop 510 is also the input 516 of the D flip-flop 510 as illustrated in FIG. 5. The D flip-flop clock is pulsed each time a row/option antifuse read signal is generated.

The row/option antifuse read signal is the second input for the X bank AND gate 520 and the second input for the Y bank AND gate 530. When the output of the X bank AND gate 520 is high, the X bank row/option antifuse circuit banks are read. Similarly, when the Y bank AND gate 530 output is high, the Y bank row/option antifuse circuit banks are read.

For example, the circuit 500 receives a row/option antifuse read signal in response to an auto refresh command. If the first output 512 of the D flip-flop 510 is high, the row/option antifuse read signal triggers a high output from the X bank AND gate 520, which in turn reads the row/option antifuse circuit banks in the X bank. The row/option antifuse read signal pulses the D flip-flop 510 clock and the output of the D flip-flop 510 toggles, forcing the second output 514 of the D flip-flop 510 high. A subsequent row/option antifuse read signal triggers a high output from the Y bank AND gate 530, which reads the row/option antifuse circuit banks in the Y bank of antifuses. In this manner, half of the row/option antifuses are read in response to each auto refresh command. Because only half of the antifuses are read during each auto refresh command signal, power is conserved, providing a more efficient memory device.

Figure 6:
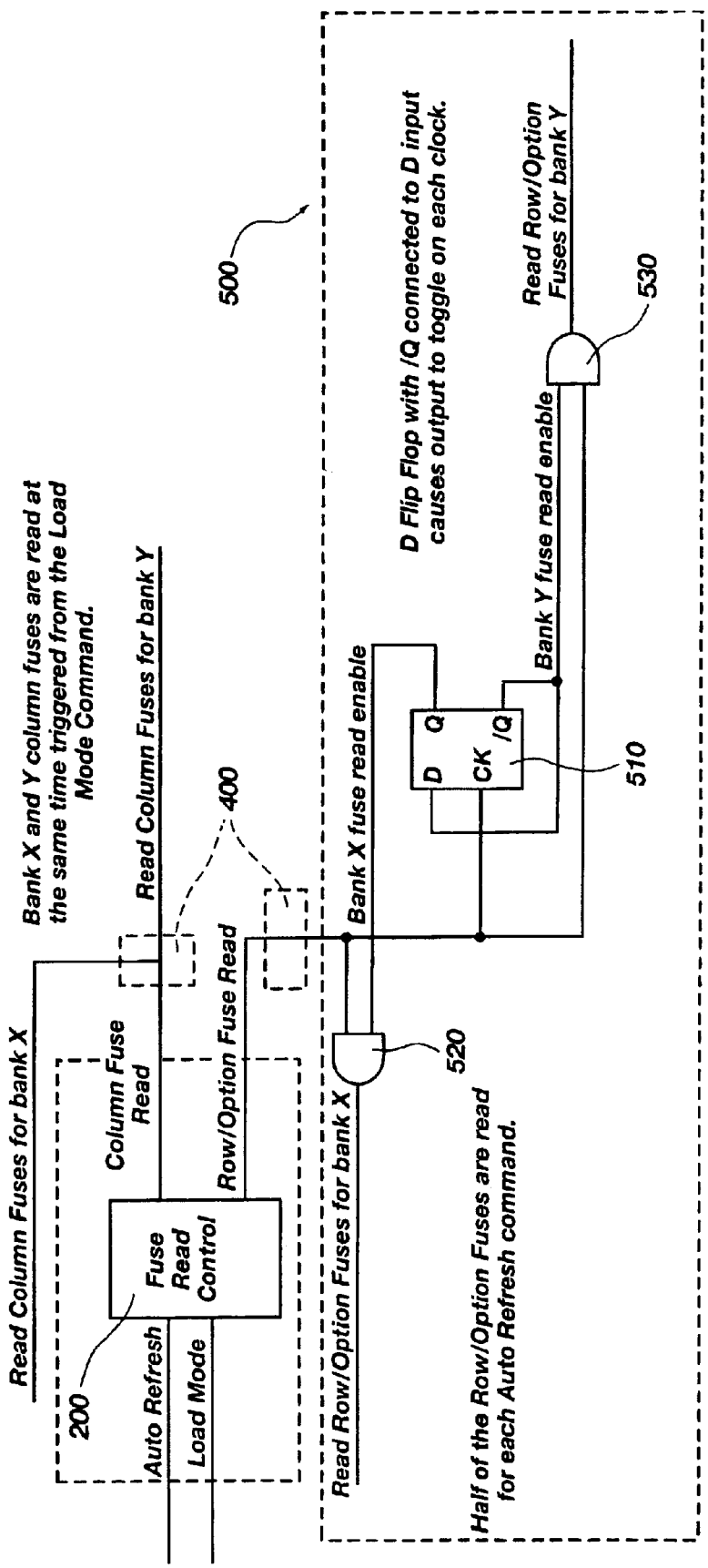
FIG. 6 is a circuit diagram of one embodiment of the present invention.

FIG. 6 illustrates another embodiment of the invention. The fuse read control 200 is operably coupled with the toggle circuit 500 to create a circuit capable of reading the column antifuse circuit banks of a memory device in response to a load mode register command and reading alternating banks of row/option antifuse circuits for each auto refresh command. Additionally, optional fuse model circuits 400 may be coupled to the column antifuse read signal and the row/option antifuse read signal to ensure that the durations of the antifuse read signals are sufficient to read all of the desired antifuse circuits.

A substantial energy savings may be realized by employing the embodiments of the present invention as depicted in FIG. 6. Operation of the circuit illustrated in FIG. 6 reduces the number of antifuse reads by up to 75% per auto refresh command. For example, after applying power to an SDRAM, a first auto refresh command is received by the fuse read control 200. Recognizing the auto refresh command, a row/option fuse read signal is generated and is coupled to the toggle circuit 500. Assuming the toggle circuit 500 is in a state to read bank X of the row/option antifuses, the fuse read signal is directed to read the antifuses in bank X. Concurrently, the termination of the fuse read signal toggles the D flip-flop 510, setting the toggle circuit 500 to read bank Y of the row/option antifuses on the next fuse read signal. A second auto refresh command received by the fuse read control 200 generates a second fuse read signal which the fuse read control 200 couples to the toggle circuit 500. Having been toggled by the first fuse read signal, bank Y of the row/option antifuses is read by the second fuse read signal. Termination of the second fuse read signal again toggles the D flip-flop 510, setting the toggle circuit 500 to read bank X of the row/option fuses on the next received fuse read signal. Thus, all of the row/option antifuses are read only once for every two auto refresh commands instead of twice as in prior art devices. A load mode register command received by the fuse read control 200 is distinguished from an auto refresh command and a fuse read signal is coupled to read the column antifuses. The column antifuses read may be in a single group or multiple groups of banks as illustrated by the X and Y column antifuse read signals in FIG. 6. Furthermore, optional fuse model circuits 400, illustrated in block form, may be incorporated with the embodiment of the invention to assure that the fuse read signals are of sufficient duration to read all of the column or row/option antifuses.

Unlike prior art memory devices, none of the row/option antifuses are read in response to the column fuse read. Likewise, the column antifuses are only read in response to the load mode register command and not the auto refresh commands. This convention eliminates two reads of the column antifuses. Thus, a significant number of antifuse reads are eliminated: two column fuse reads and a total of two row/option fuse reads. This results in a substantial energy savings.

Figure 7:
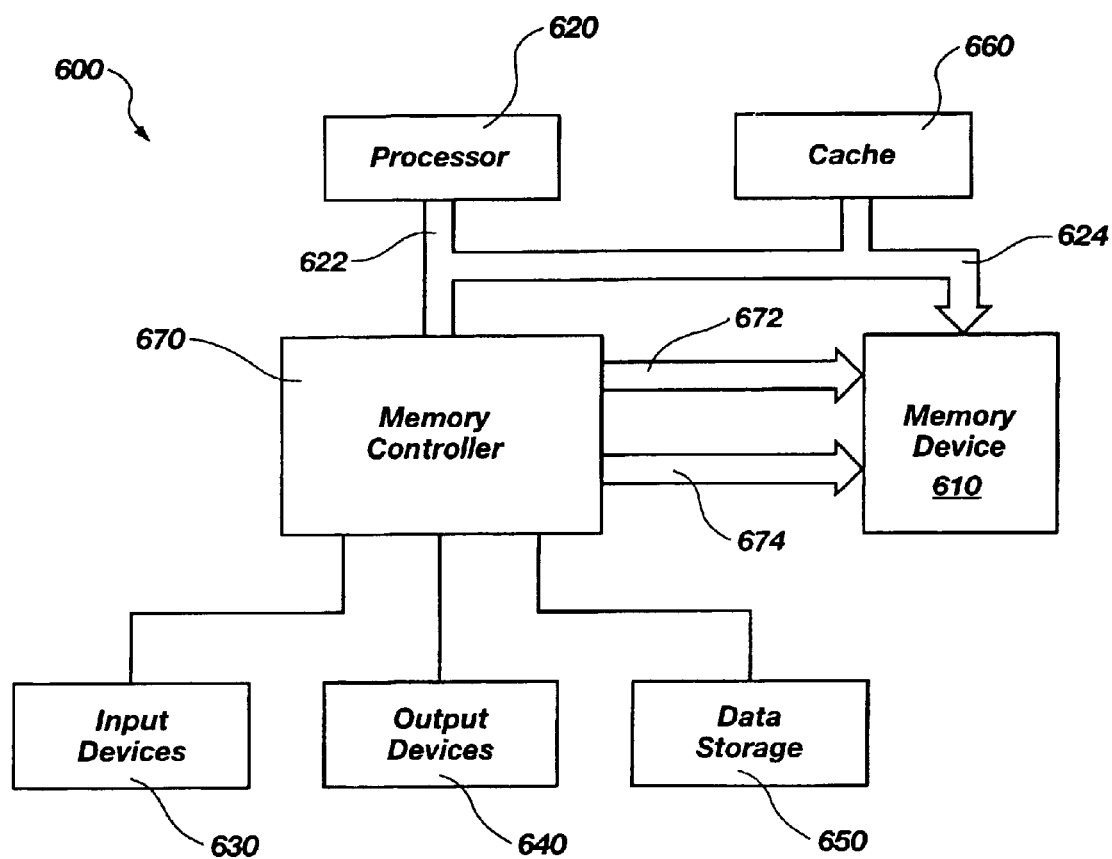
FIG. 7 is a block diagram of a computer system using the embodiments of the present invention.

FIG. 7 is a block diagram of a computer system 600 that includes a memory device 610 comprising circuits as described with respect to FIGS. 2 through 6 according to the embodiments of the present invention. The computer system 600 includes a processor 620 for performing computing functions as known in the art, one or more input devices 630 as known in the art, and one or more output devices 640. One or more data storage devices 650 may also be coupled to the computer system to allow the processor 620 to store or retrieve data. The processor 620 includes a processor bus 622 that includes an address bus, a control bus, and a data bus. The processor 620 is also coupled to a cache memory 660 and to the memory device 610 through a memory controller 670. A data bus 624 is also coupled between the memory device 610 and the processor bus 622. The memory controller 670 includes a control bus 672 and an address bus 674 coupled to the memory device 610.

The present invention reduces the power consumption of memory devices, especially during auto refresh cycles. The amount of current or power required to operate memory devices employing the present invention is reduced because the number of fuses being read is reduced by up to approximately 75%. Where a plurality of memory devices is used, such as in computer systems, memory devices employing aspects of the present invention realize a substantial energy savings for the system.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

What is claimed is:

1. A circuit for generating an antifuse read sequence in a memory device, comprising:

an antifuse read control for generating a first read signal in response to a first memory read command and a second read signal in response to a second memory read command;

at least one input operably coupled to the antifuse read control for conducting a command signal to the antifuse read control;

a first output operably connected to the antifuse read control for conducting the first read signal from the antifuse read control in response to the first memory read command conducted to the antifuse read control through the at least one input; and a second output operably connected to the antifuse read control for conducting the second read signal from the antifuse read control in response to the second memory read command conducted to the antifuse read control through the at least one input.

2. The circuit of claim 1, further comprising a fuse model circuit operably coupled to the first output to receive the first read signal and generate the fuse read signal of sufficient duration to read all column antifuses in the memory device.

3. The circuit of claim 1, further comprising a fuse model circuit operably coupled to the second output to receive the second read signal and generate the fuse read signal of sufficient duration to read all row/option antifuses in the memory device.

4. The circuit of claim 1, wherein the at least one input comprises:

a first memory read command input operably coupled to the antifuse read control for conducting the first memory read commands within the memory device; and a second memory read command input operably coupled to the antifuse read control for conducting the second memory read commands within the memory device.

5. The circuit of claim 1, further comprising a fuse read toggle circuit operably coupled to the second output.

6. The circuit of claim 5, wherein the fuse read toggle circuit comprises:

a fuse read signal input operably coupling the fuse read toggle circuit to the second output of the antifuse read control;

a delay flip-flop comprising a clock operably connected to the fuse read signal input, a delay flip-flop input, a first delay output, and a second delay output operably connected to the delay flip-flop input;

a first AND gate operably coupled to the fuse read signal input and the first delay output, the first AND gate also having a first AND gate output for conducting a first fuse read signal; and a second AND gate operably coupled to the fuse read signal input and the second delay output, the second AND gate also having a second AND gate output for conducting a second fuse read signal.

7. A fuse read signal toggle circuit comprising:

a fuse read signal input for receiving a fuse read signal;

a delay flip-flop comprising a clock operably connected to the fuse read signal input, a delay flip-flop input, a first delay output, and a second delay output operably connected to the delay flip-flop input;

a first AND gate operably coupled to the fuse read signal input and the first delay output, the first AND gate also having a first AND gate output for conducting a first fuse read signal; and a second AND gate operably coupled to the fuse read signal input and the second delay output, the second AND gate also having a second AND gate output for conducting a second fuse read signal.

\* \* \* \* \*